(12) United States Patent
Tuma et al.

(10) Patent No.: US 11,002,692 B2
(45) Date of Patent: May 11, 2021

(54) METHOD OF EXAMINING A SAMPLE USING A CHARGED PARTICLE MICROSCOPE

(71) Applicant: FEI Company, Hillsboro, OR (US)

(72) Inventors: Tomas Tuma, Brno (CZ); Jan Hradil, Brno (CZ); Petr Hlavenka, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/533,291

(22) Filed: Aug. 6, 2019

(65) Prior Publication Data

US 2020/0057011 A1    Feb. 20, 2020

(30) Foreign Application Priority Data

Aug. 20, 2018  (EP) ..................................... 18189761

(51) Int. Cl.
*G01N 23/2252* (2018.01)
*G01J 3/44* (2006.01)
*H01J 37/28* (2006.01)

(52) U.S. Cl.
CPC ............ *G01N 23/2252* (2013.01); *G01J 3/44* (2013.01); *H01J 37/28* (2013.01);
(Continued)

(58) Field of Classification Search
CPC ......... G01N 23/2252; G01N 2223/402; G01N 2223/418; G01N 23/203; G01N 23/2206;
(Continued)

(56) References Cited

U.S. PATENT DOCUMENTS 5,357,110 A * 10/1994 Statham ............... G01N 23/223
                                              250/307
7,490,009 B2 * 2/2009 Gottlieb ............. G01N 23/2252
                                              702/32
(Continued)

FOREIGN PATENT DOCUMENTS

EP       2282197 A2    2/2011
EP       2546638 A2    1/2013

OTHER PUBLICATIONS

Cappellari and Copin, "Adaptive Spatial Binning of 2D Spectra and Images Using Voronoi Tessellations", Galaxies: The Third Dimension, ASP Conference Series, vol. 000, 2002.†

(Continued)

*Primary Examiner* — David A Vanore

(57) ABSTRACT

The disclosure relates to a method of examining a sample using a charged particle microscope. The method comprises the steps of detecting using a first detector emissions of a first type from the sample in response to the beam scanned over the area of the sample. Then, using spectral information of detected emissions of the first type, at least a part of the scanned area of the sample is divided into multiple segments. According to the disclosure, emissions of the first type at different positions along the scan in at least one of said multiple segments may be combined to produce a combined spectrum of the sample in said one of said multiple segments. In an embodiment, a second detector is used to detect emissions of a second type, and this is used to divide the area of the sample into multiple regions. The first detector may be an EDS, and the second detector may be based on EM. This way, EDS data and EM data can be effectively combined for producing colored images.

19 Claims, 6 Drawing Sheets

(52) U.S. Cl.
CPC .............. *H01J 2237/2442* (2013.01); *H01J 2237/24495* (2013.01); *H01J 2237/2802* (2013.01)

(58) Field of Classification Search
CPC ....... G01N 2223/053; G01N 2223/072; G01N 2223/076; G01N 2223/079; G01N 2223/102; G01N 2223/427; G01N 23/2208; G01N 23/225; G01N 23/2251; H01J 37/28; H01J 37/261; H01J 2237/221; H01J 2237/2445; H01J 2237/24475; H01J 2237/2442
USPC ......................... 250/307, 310, 306, 305, 309
See application file for complete search history.

(56) References Cited

U.S. PATENT DOCUMENTS

| | | | | |
|---|---|---|---|---|
| 8,450,215 | B2* | 5/2013 | Mantz | H01J 37/222 |
| | | | | 438/706 |
| 10,453,646 | B2* | 10/2019 | Alvis | H01J 37/28 |
| 10,614,998 | B2 | 4/2020 | Geurts | G06T 7/269 |
| 10,620,142 | B2* | 4/2020 | Owen | G01N 23/2252 |
| 2003/0089851 | A1* | 5/2003 | Katagami | H01J 37/256 |
| | | | | 250/307 |
| 2008/0027657 | A1* | 1/2008 | Rohde | G01N 23/225 |
| | | | | 702/28 |
| 2013/0015351 | A1* | 1/2013 | Kooijman | G01N 23/203 |
| | | | | 250/307 |
| 2014/0183357 | A1* | 7/2014 | Smith | H01J 37/21 |
| | | | | 250/307 |
| 2015/0122992 | A1* | 5/2015 | Owen | G01N 23/225 |
| | | | | 250/307 |
| 2016/0184736 | A1* | 6/2016 | Wyndham | B01J 20/28004 |
| | | | | 210/656 |
| 2016/0245762 | A1* | 8/2016 | Owen | G01N 23/2252 |
| 2018/0061613 | A1* | 3/2018 | Sed'a | G21K 7/00 |
| 2019/0378681 | A1* | 12/2019 | Stejskal | H01J 37/20 |
| 2020/0057011 | A1* | 2/2020 | Tuma | G01J 3/44 |

OTHER PUBLICATIONS

Sanders, J.S., "Contour binning: a new technique for spatially-resolved X-ray spectroscopy applied to Cassiopeia A", Mon. Not. R. Astron. Soc. 000, 000-000 (0000), Jun. 21, 2006.†
Mott and Friel, "Saving the photons: mapping X-rays by position tagged spectrometry", Journal of Microscopy, vol. 193, Pt 1, Jan. 1999, pp. 2-14.†
Thompson, K., "Unleashing the Power of COMPASS", Thermo Fisher Scientific, Jun. 2012, available at http://tools.thermofisher.com/content/sfs/brochures/WS52733-Power-of-COMPASS.pdf.†
Haschke, M., Laboratory Micro-X-Ray Fluorescence Spectroscopy: Instrumentation and Applications, pp. 143-144 and 147-148, Springer Science & Business Media, 2014, ISBN 3319048643, 9783319048642.†

* cited by examiner
† cited by third party

METHOD OF EXAMINING A SAMPLE USING A CHARGED PARTICLE MICROSCOPE

FIELD OF THE INVENTION

The disclosure relates to a method of examining a sample using a charged particle microscope, comprising the steps of detecting using a first detector emissions of a first type from the sample in response to a charged particle beam scanned over the area of the sample, and using spectral information of detected emissions of the first type for examining said sample.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically, in a SEM backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image merely provides information on the topology of the sample to be examined.

In a process called "energy dispersive x-ray spectroscopy" or "EDS", the energies of x-rays coming from the sample in response to the electron beam are measured and plotted in a histogram to form a material specific spectrum. The measured spectrum can be compared to known spectra of various elements to determine which elements and minerals are present in said sample.

One of the drawbacks of EDS is that it takes considerable time to accumulate an x-ray spectrum for the sample. Typically, a grid with discrete analysis points is used. The electron beam dwells on each analysis point while the EDS detectors record x-rays. Once sufficient x-ray counts are recorded the beam moves to the next analysis point. The signal from the EDS detectors is fed to a signal processing unit that builds an x-ray spectrum curve for each analysis point, which can be matched to an extensive library of known mineral phases to select the best match for that analysis point.

SUMMARY

It is therefore an object of the present disclosure to provide an improved method of examining a sample using a charged particle microscope, wherein spectral information of detected emissions is used for examining said sample. In particular, it is an object of the present disclosure to provide a method and apparatus for more rapidly and/or more accurately acquiring information about a sample.

To this end, the disclosure provides a method of examining a sample using a charged particle microscope, as defined in claim 1. The method comprises the step of detecting, using a first detector, emissions of a first type from the sample in response to the beam scanned over the area of the sample. The method furthermore comprises collecting spectral information of said detected emissions of said first type. Said spectral information of detected emissions of the first type is used for dividing at least a part of the scanned area of the sample into multiple segments. According to the disclosure emissions of the first type at different positions along the scan in at least one of said multiple segments are combined to produce a combined spectrum of the sample in said one of said multiple segments.

Thus, spectral information of said detected emissions of said first type is collected during scanning of the beam over the area of the sample. The emissions detected by the first detector can be related to a specific scanning beam position, i.e. can be related to a specific position on the sample. This means that spectral information may be collected and/or determined for corresponding positions on the sample as well. The obtained spectral information for different positions, may be compared to each other. In particular, in case the spectral information associated with two or more distinct positions is substantially the same, then this means these points on the sample are likely to be similar, e.g. in chemical composition, and are thus related to each other. Thus, the information relating to these two or more distinct positions—but having similar characteristics—may be used to group these positions together and define a first segment of the sample being examined. Likewise, two or more further distinct positions having substantially the same or similar spectral information may be grouped together as well for defining a second segment of the sample being examined.

Rather than collecting complete spectral information for a distinct analysis point and then moving on to the next analysis point, in the method according to the disclosure the beam is used to scan the sample and collect spectral information for multiple analysis points at the same time. The scanning of the beam is relatively fast and may be continuously or semi-continuously scanned over the area of the sample to be examined. After one or more scans, the spectral information obtained may be sparse, i.e. meaning that some analysis points may indeed provide information, whilst other analysis points do not. However, by grouping similar analysis points together into segments, and combining emissions of the first type at analysis points in respective segments for producing a combined spectrum in said segments, the method according to the disclosure is capable of providing qualitative information for the entire sample more rapidly. In addition, the accuracy of the method according to the disclosure is further improved in case the sample is scanned multiple times, as in that case the sparsity of the data collected will decrease. Hence, from the above it follows that the object of the disclosure is achieved.

Further embodiments of the disclosure are subject to the dependent claims. Details of these further embodiments will be explained below.

In an embodiment, the method comprises the additional step of dividing at least one of said multiple segments into multiple sub-segments. In particular spectral information of detected emissions of the first type is used for dividing one of said multiple segments into multiple sub-segments. This way, for example, the information obtained during repeatedly scanning with the beam is used to further refine the segments into smaller sub-segments. For these smaller sub-segments, emissions of the first type at different positions along the scan may be combined to produce a combined sub-spectrum of the sample in said one of said multiple sub-segments. This way more accurate and more detailed information on the sample can be obtained.

In an embodiment, the method further comprises the steps of:

detecting using a second detector emissions of a second type from the sample in response to said beam scanned over said area of said sample;

using emissions of the second type, dividing the scanned area of the sample into multiple regions;

combining emissions of the first type at different positions along the scan in at least one of said multiple regions to produce a combined spectrum of the sample in the region.

In this embodiment, an additional detector is used to detect emissions of a second type. These emissions of the second type are different from the emissions of the first type. The information relating to these emissions of the second type is used to define regions of the sample. These regions are then used for producing a combined spectrum of the sample in the region, using emissions of the first type.

In an embodiment, said step of dividing the scanned area of the sample into multiple regions is performed prior to said step of dividing at least a part of the scanned area of the sample into multiple segments. In particular, the emissions of the second type may provide an information rate that is higher compared to the emissions of the first type. In other words, the process of detecting a significant signal relating to emissions of the second type is much faster than the process of detecting a significant signal relating to emissions of the first type. Thus, the additional detector may be used to provide an initial division of the sample into regions that are likely to have similar properties, and emissions of the first type are then grouped for these regions. This increases the quality and speed of the method as described herein.

In an embodiment, said step of dividing at least a part of the scanned area of the sample into multiple segments is performed for dividing at least one of the multiple regions. Thus, the information relating to the emissions of the second type is used for creating regions, and the information relating to the emissions of the first type is used for sub-dividing at least one of those regions into multiple segments.

In an embodiment, said second detector is arranged for detecting charged particles, in particular electrons, such as backscattered electrons. It is furthermore conceivable that said first detector is arranged for detecting particles, in particular photons, such as x-ray photons.

Backscattering of electrons depends on the atomic number of the elements in the surface and upon the geometric relationship between the surface, the primary beam, and the detector. The backscattered electron image therefore shows contour information, that is, boundaries between regions of different composition, and topographical information. Obtaining a backscattered electron image requires collecting only a sufficient number of electrons at each point to produce a reasonable contrast between points having different properties and so is much faster than obtaining a sufficient number of x-rays to compile a complete spectrum at each point. Also, the probability of an electron being backscattered is greater than the probability of the electron causing the emission of a characteristic x-ray of a particular frequency. Obtaining sufficient backscattered electron image data at a single dwell point typically takes less than a microsecond, whereas acquiring sufficient x-rays to obtain an analyzable spectrum at a single dwell point typically takes more than a millisecond.

In an embodiment of the disclosure, an image is first acquired using a backscattered electron detector, and the image is then processed to identify regions that appear from the contrast to have the same elemental composition. The beam is then scanned over the sample, at least over one or more of the identified regions, and preferably multiple times, to collect an x-ray spectrum representative of the region and for dividing said region into multiple segments, and subsequently into multiple sub-segments. X-rays generated during the backscattered electron detector scan may advantageously be used to already obtain information that may be used in the subsequent segmentation.

As stated before, the method may comprise the step of additionally scanning at least a part the area of the sample to be examined, and detecting using said first detector emissions of said first type in response to said additional scanning. By repeatedly scanning, in a continuous or semi-continuous way, more information relating to said first type emissions can be obtained, to further improve the acquired information.

Advantageously, the step of using emissions of the first type and using emissions of the second type may be used for providing a single colored image of said sample to be examined. In particular, the colored image may contain data representative of emissions of the first type and of the second type. This is in particular advantageous when backscattered electron image data is used in combination with EDS data, as it allows the—typically grayscale—backscattered electron image to be combined with color information resulting from the EDS data.

In particular when use is made of segment information and sub-segment information for providing said colored image, a quick method is obtained for providing a colored image of a sample to be examined, wherein said colored image at the same time may provide meaningful information of said sample. In particular, the colored image may be presented in real time, i.e. may be generated in a few seconds or even less. This way, the user can examine the sample more quickly, as he is, for example, able to more quickly identify regions of interest on the sample.

Color information may be coded in a color space comprising hue, value and chroma. Emissions of the first type are used for defining at least one of hue and chroma of the colored image; and emissions of the second type are used for defining value of the colored image. Thus in an embodiment, EDS data is used to define the color and color intensity of the image, whilst EM data is used as grayscale data.

In an embodiment, hue is used for defining material properties of the sample to be examined. For example, the combined spectrum of the sample in said one of said multiple segments may be converted into a hue value, such as red, blue, yellow, green, etc., and said hue value may be used as a representation of the chemical composition of said segment. This way, for example, it is possible to identify regions having, for example, C, O, Al, Si, Mn, Fe, and Ag atoms, as each atom can be pre-set to correspond to a different color. It is conceivable in this sense, that chroma, i.e. the saturation of the color, is used for defining a measure of confidence of said material properties. For example, when confidence is low, the image presented can be a complete grayscale image (no chroma). As data relating to the emissions of the first type increases, the confidence increases as well, and thus a paler image can be presented. After some time, the confidence will be maximal, and thus a full color, fully saturated image can be presented. This way, the available color space (hue, value, chroma) is fully used to represent valuable information to the user.

According to the disclosure, the emissions of the first type are used to identify multiple segments, and for those multiple segments emissions of the first type are combined to establish a combined spectrum of that respective segment. Additionally, in an embodiment, those multiple segments are further divided into sub-segments when more data relating to emissions of the first type is available. This means that during scanning more information is obtained and this information is used to further sub-divide the segments into smaller sub-segments. In other words, the granularity increases. This may be used to present a colored image to the user, wherein emissions of the first type are used to represent hue and/or chroma (i.e. color information), and wherein emissions of the second type are used to represent value (i.e. a normal EM image in grayscale). Emissions of the second type have a relatively fast information rate, meaning that it is possible to almost instantaneously present the grayscale image to the user. Emissions of the first type have a relatively slow information rate, meaning that it takes more time to obtain information for the entire scanned area of the sample. By grouping similar information together, and presenting this grouped information as hue and chroma on top of the grayscale image obtained by EM data, the user is immediately presented with relevant information (i.e. EM data) and as time goes by (i.e. in the order of seconds) more information is gradually added onto that. Moreover, the quality of the data is also gradually increased over time, due to the fact that segments are sub-divided into sub-segments and information is grouped together. All in all, a gradually changing colored image is presented to the user, which provides a very user-friendly experience.

According to an aspect of the disclosure, a charged particle microscope for examining a sample using the method as described above is provided. The apparatus according to the disclosure comprises:

an optics column, including a charged particle source, a final probe forming lens and a scanner, for focusing a beam of charged particles emitted from said charged particle source onto a specimen;

a specimen stage positioned downstream of said final probe forming lens and arranged for holding said specimen;

a first detector for detecting emissions of a first type originating from said specimen in response to the incidence of charged particles emitted from said charged particle source; and control unit and a processing device connected to said first detector.

According to the disclosure, said charged particle microscope is arranged for executing the method according to the disclosure. Thus, in particular, the apparatus is arranged for detecting using said first detector emissions of a first type from the sample in response to the beam of charged particles being scanned over the area of the sample. The detected emissions of the first type are collected into spectral information, for example by means of the processing device, and this spectral information is used for dividing at least a part of the scanned area of the sample into multiple segments. Additionally, the apparatus is arranged for combining emissions of the first type at different positions along the scan in at least one of said multiple segments to produce a combined spectrum of the sample in said one of said multiple segments. In particular, the processing device is arranged for combining said emissions for producing a combined spectrum of the sample in the respective segments. Thus, with the apparatus it is possible to collect and combine spectral information for related segments which provides relevant information in a relatively fast way, i.e. in a way faster than collecting complete spectral information for a distinct analysis point and then moving on to the next analysis point. Thus, an apparatus is obtained with which information about the sample can be acquired in a more rapid and/or more accurate way. Thus, the object of the disclosure is achieved.

In an embodiment, the apparatus further comprises a second detector for detecting emissions of a second type originating from said specimen in response to the incidence of charged particles emitted from said charged particle source. In particular, a data acquisition rate of said second type may be larger than a data acquisition rate of said first type. In other words, the second detector may provide information more rapidly than the first detector and said processor may be arranged for using said data of the second detector for processing data of the first detector. As already described with respect to the method, it is conceivable that the information relating to the data of the second type is used to provide regions of the sample, which regions are then used to produce a combined spectrum of emissions of the first type of the sample in respective regions. According to the method of the disclosure, said regions may then be sub-divided into multiple segments, and a combined spectrum may be produced for each of said multiple segments.

In an embodiment, the apparatus further comprising an output device for outputting a combination of processed first detector information and of processed second detector information, in particular wherein the output device is arranged for outputting a colored image, wherein a color space of said colored image comprises hue, value and chroma. Here, emissions of the first type may be used for defining at least one of hue and chroma of the colored image; and emissions of the second type may be used for defining value of the colored image.

Said second detector may in an embodiment be a backscattered electron detector. Said first detector may in an embodiment be an EDS detector. The backscattered electron detector in combination with the EDS detector are able to quickly provide an informative image of the sample to be examined, such as a colored image of the sample containing both EM information and chemical composition information. It will of course be understood that other detectors may be used as well, and that the use of those detectors may provide specific advantages as well.

The disclosure will now be elucidated in more detail on the basis of exemplary embodiments and the accompanying schematic drawings, in which:

DETAILED DESCRIPTION OF THE EMBODIMENTS

Figure 1:
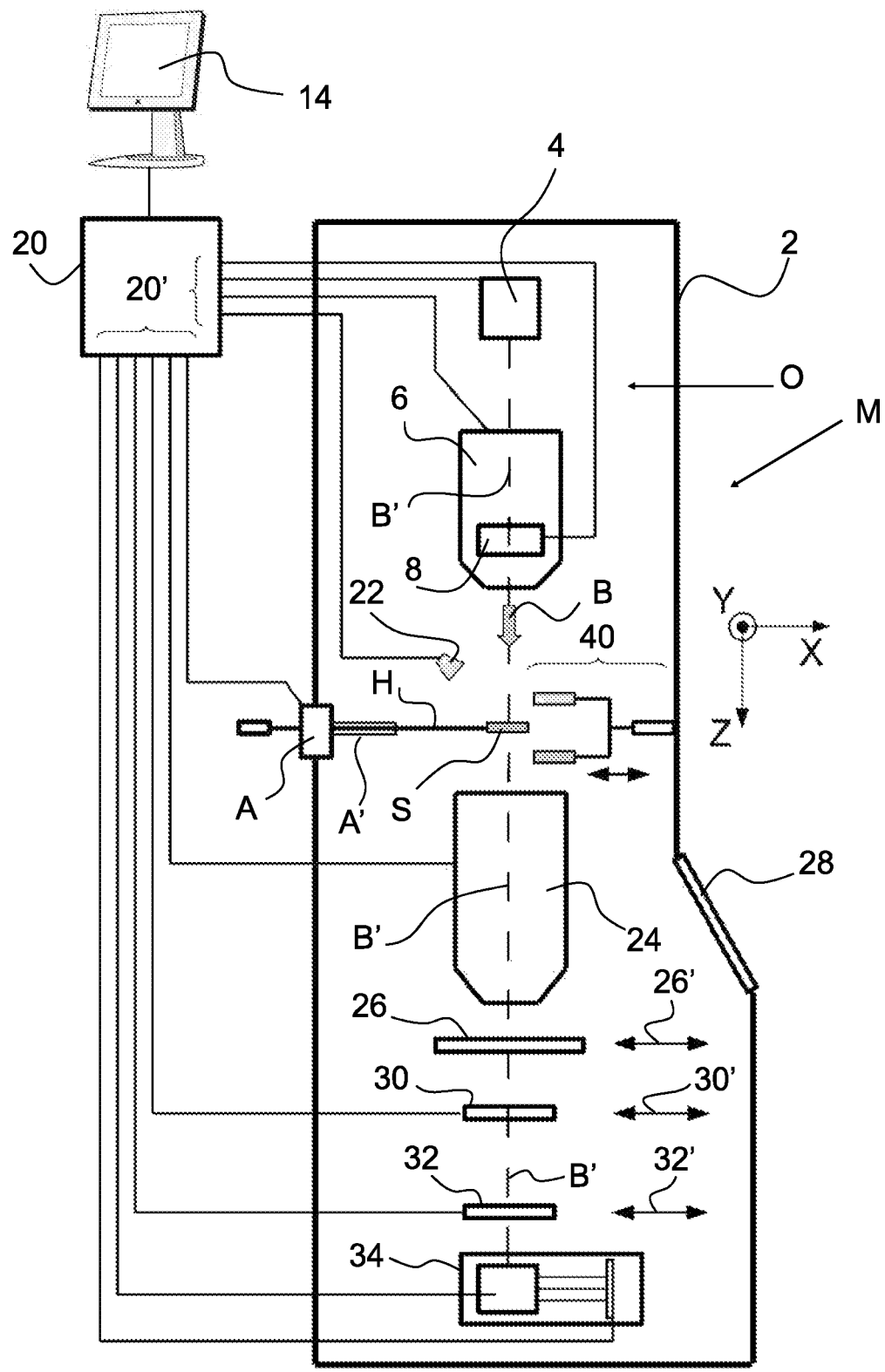
FIG. 1—shows a longitudinal cross-sectional view of a charged particle microscope according to an embodiment of the disclosure.

FIG. 1 (not to scale) is a highly schematic depiction of an embodiment of a charged-particle microscope M according to an embodiment of the disclosure. More specifically, it shows an embodiment of a transmission-type microscope M, which, in this case, is a TEM/STEM (though, in the context of the current disclosure, it could just as validly be an SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in an SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M according to the disclosure, and of which an embodiment is shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is the analysis device 22, which—as mentioned before—might be a combined scintillator/photomultiplier or EDS (Energy-Dispersive X-Ray Spectroscopy) module. In a preferred embodiment, said first detector is an EDS. Furthermore, the apparatus according to the disclosure comprises the control device 20 that is connected (by means of lines 20') to said first detector 22 (schematically shown). According to the disclosure, said charged particle microscope M is arranged for executing the method according to the disclosure, which will later be explained by means of FIG. 3 to FIG. 5.

Figure 2:
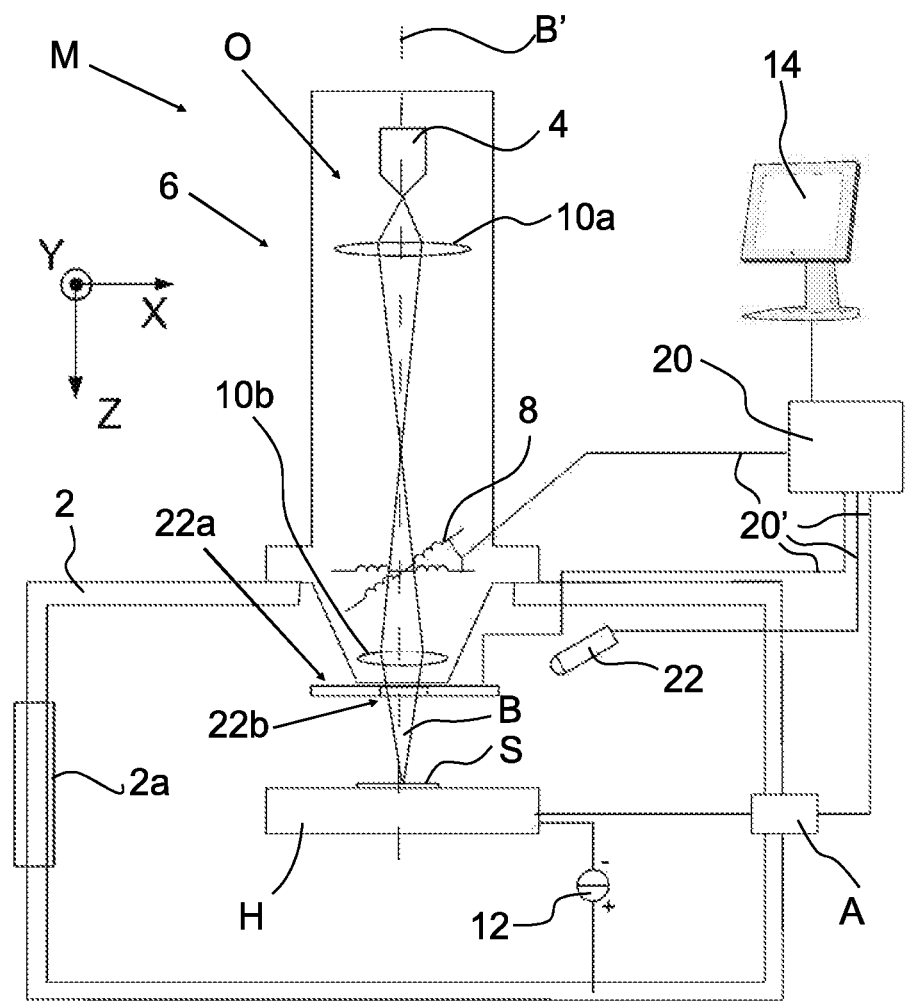
FIG. 2—shows a longitudinal cross-sectional view of a charged particle microscope according to an embodiment of the disclosure.

Now first referring to FIG. 2, another embodiment of an apparatus according to the disclosure is shown. FIG. 2 (not to scale) is a highly schematic depiction of a charged-particle microscope M according to the present disclosure; more specifically, it shows an embodiment of a non-transmission-type microscope M, which, in this case, is a SEM (though, in the context of the current disclosure, it could just as validly be an ion-based microscope, for example). In the Figure, parts which correspond to items in FIG. 1 are indicated using identical reference symbols and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as an FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Thus the charged particle microscope M as shown in FIG. 2 comprises an optics column O, including a charged particle source 4, a final probe forming lens 6, 10a, 10b and a scanner 8, for focusing a beam B of charged particles emitted from said charged particle source 4 onto a specimen S. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is said analysis device 22, which—as mentioned before—might be a combined scintillator/photomultiplier or EDS (Energy-Dispersive X-Ray Spectroscopy) module. In an alternative embodiment, the first detector 22 may be the segmented detector 22a, 22b. In a preferred embodiment, said first detector is an EDS. Furthermore, the apparatus according to the disclosure comprises said control device 20 that is connected (by means of lines 20') to said first detector 22.

Figure 3:
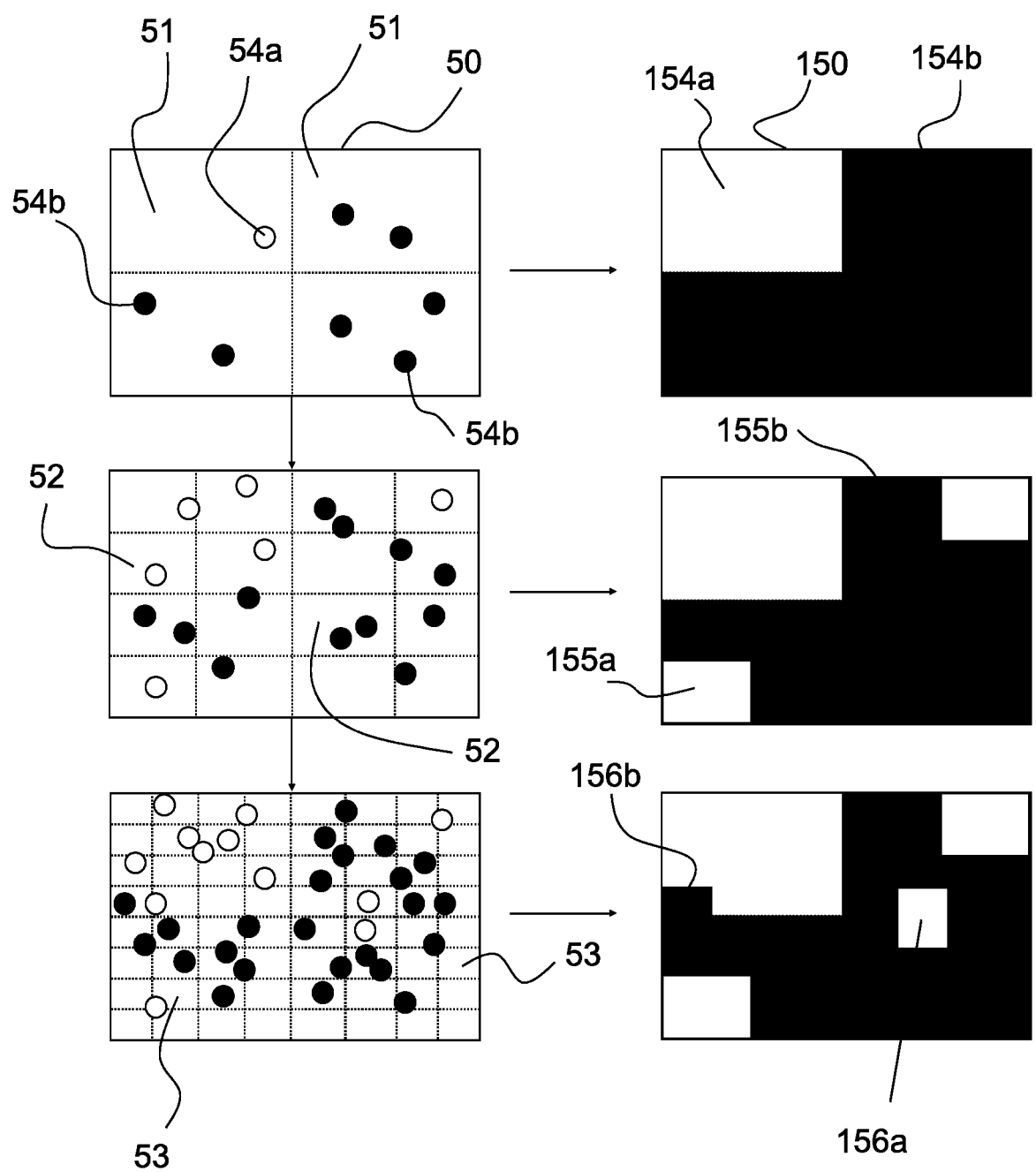
FIG. 3—show a schematic overview of an embodiment of the method according to the disclosure.
Figure 4:
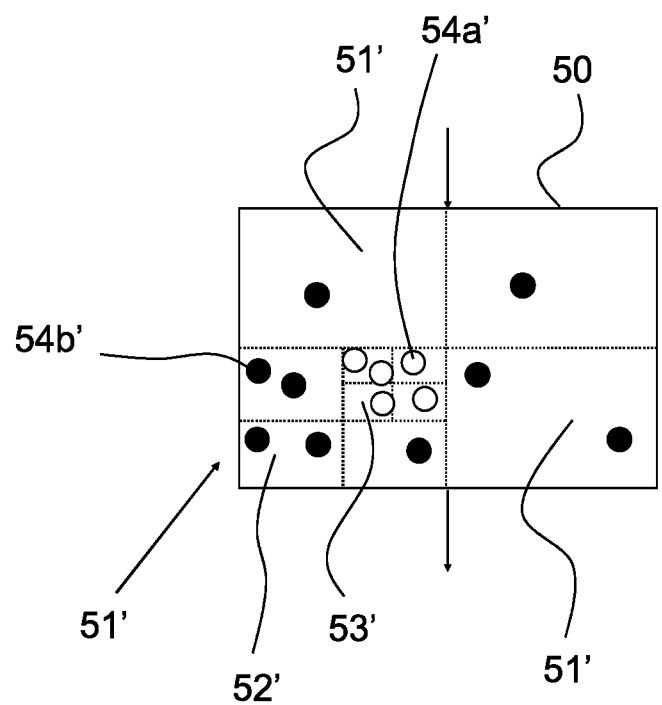
FIG. 4—shows a schematic overview of a further embodiment of the method according to the disclosure.
Figure 5:
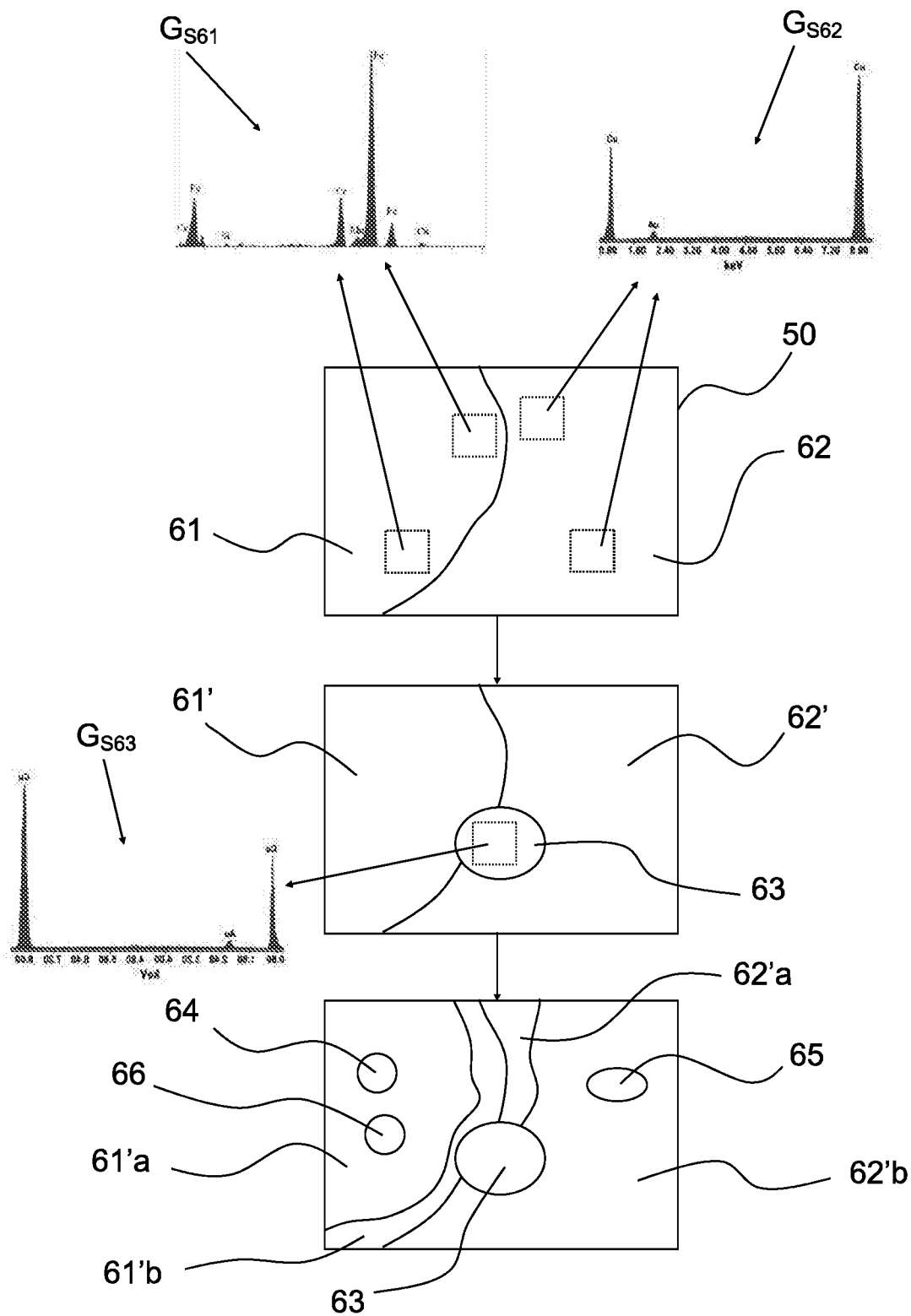
FIG. 5—shows a schematic overview of another embodiment of the method according to the disclosure.

The apparatus shown in FIG. 1 and FIG. 2 may be used in examining a sample with a method according to the disclosure. Several embodiments of the method according to the disclosure are shown in FIG. 3 to FIG. 5. In general, these methods all comprise the steps of:

detecting using the first detector 22 emissions of a first type from the sample in response to the beam B scanned over the area 50 of the sample S;

using spectral information G of detected emissions of the first type, dividing at least a part of the scanned area 50 of the sample into multiple segments 51; 61,62; 81-87; and combining emissions of the first type at different positions along the scan in at least one of said multiple segments 51; 61,62; 81-87 to produce a combined spectrum of the sample in said one of said multiple segments.

Now referring to FIG. 3, an embodiment of the method according to the disclosure is schematically shown. FIG. 3 schematically shows, in the left-hand side, an area 50 of a sample to be examined with acquired data 54a, 54b, and on the right-hand side a representation 150 of the acquired data.

The area 50 of the sample is scanned with a beam of charged particles. The first detector, for example an EDS detector as described with reference to FIG. 1 and FIG. 2, is used to detect emissions of a first type from the sample in response to the beam scanned over the area 50 of the sample. These emissions are schematically indicated by data points 54a (white dots) and 54b (black dots) in FIG. 3. Data points 54a represent a different emission than data points 54b, i.e. meaning that the detector detects a different signal at these different locations. For example, this could be the result of the white points 54a representing a first material, and the black points 54b representing a second material (that is different from said first material). As shown in the left-hand side sequence, from top to bottom, the data information 54a, 54b is relatively sparse in the beginning, and increases as scanning is continued. In the top most step, spectral information of detected emissions 54a, 54b of the first type is used to divide the scanned area 50 of the sample into multiple segments 51. Here, the scanned area 50 is divided into four regular, rectangular segments 51, although this shape and this regularity is not required, as will be described later in reference to FIG. 4-6.

Now referring to the right hand side of FIG. 3, which shows the representation 150 of the acquired data, it can be seen that for each segment 51, emissions of the first type at different positions along the scan in each of the segments 51 are combined to produce a combined spectrum of that segment 51. In the embodiment shown this means that if there are substantially only black points in a segment 51, the segment is represented as a black segment 154b. If there are substantially only white points, that segment is represented as a white segment 154a. In other words, the area 150 of the sample is divided into segments 51, and each segment is given a representation value 154a, 154b depending on the data points allocated in the respective segment 51. One skilled in the art will understand that the acquired data 54a, 54b can, in principle, have many values (not only black or white), and that the representation values can be arbitrarily selected in dependence of the desired application. The example shown is merely an illustration of a single possibility and is not intended to be limiting.

Now, as the number of data points 54a, 54b increases (in the sequence of FIG. 3: from top to bottom) the segments 51 can be subdivided into multiple sub-segments 52, and into even smaller sub-segments 53. Spectral information of the segments 51 and sub-segments 52 is used for this, respectively. In an embodiment, this means that the total number of data points is used for sub-dividing into one or more sub-segments: once the total number of data points exceeds a certain threshold a division into segments, sub-segments or further sub-segments is made.

For these sub-segments, spectral information of detected emissions 54a, 54b of the first type in each of said sub-segments (or smaller sub-segments) is used to provide a combined sub-spectrum 155a, 155b, or further sub-spectrum 156a, 156b, of the sample that can be used as representation value (see right hand side of FIG. 3). Thus, it can be seen that, the granularity and accuracy of the represented data (right hand side) increases as more data points are acquired: the image becomes more detailed and contains more information.

FIG. 4 shows that, in an embodiment, the division into sub-segments does not need to take place simultaneously for each segment 51. As FIG. 4 shows, a segment 51' can be divided into sub-segments 52' once sufficient data points 54a', 54b' are contained in that segment 51'. In case there aren't a sufficient number of data points, that segment is not divided into sub-segments. The same holds true for a division of sub-segments 52' into further sub-segments 53'. In the embodiment shown in FIG. 4, the white data points are numerous and located relatively close to one another, such that a local division into sub-segments 52' and further sub-segments 53' is very convenient. On the other hand, in the top-right segment there is only a single black data point, such that no sub-division is made for this segment.

FIG. 5 shows that the segments and sub-segments do not have to have a regular shape. In the beginning, the area 50 of the sample is scanned, and spectral information $G_{s61}$, $G_{s62}$ is used to divide the area 50 into segments 61, 62. Here, the shape of the segments 61, 62 is irregular, i.e. not square or rectangular. As more information is obtained during further scanning, the further spectral information $G_{s63}$ is used to adjust the shape of segments 61, 62 into adjusted segments 61', 62' and to create a further segment 63. Additional segments 64, 65, 66 are also introduced. These segments 61-66 (including adjusted segments 61', 62') can then be divided into sub-segments 61'a, 61'b, 62'a, 62'b, for example, as shown in FIG. 5. A further division into further sub-segments (not shown) is possible as well.

Figure 6:
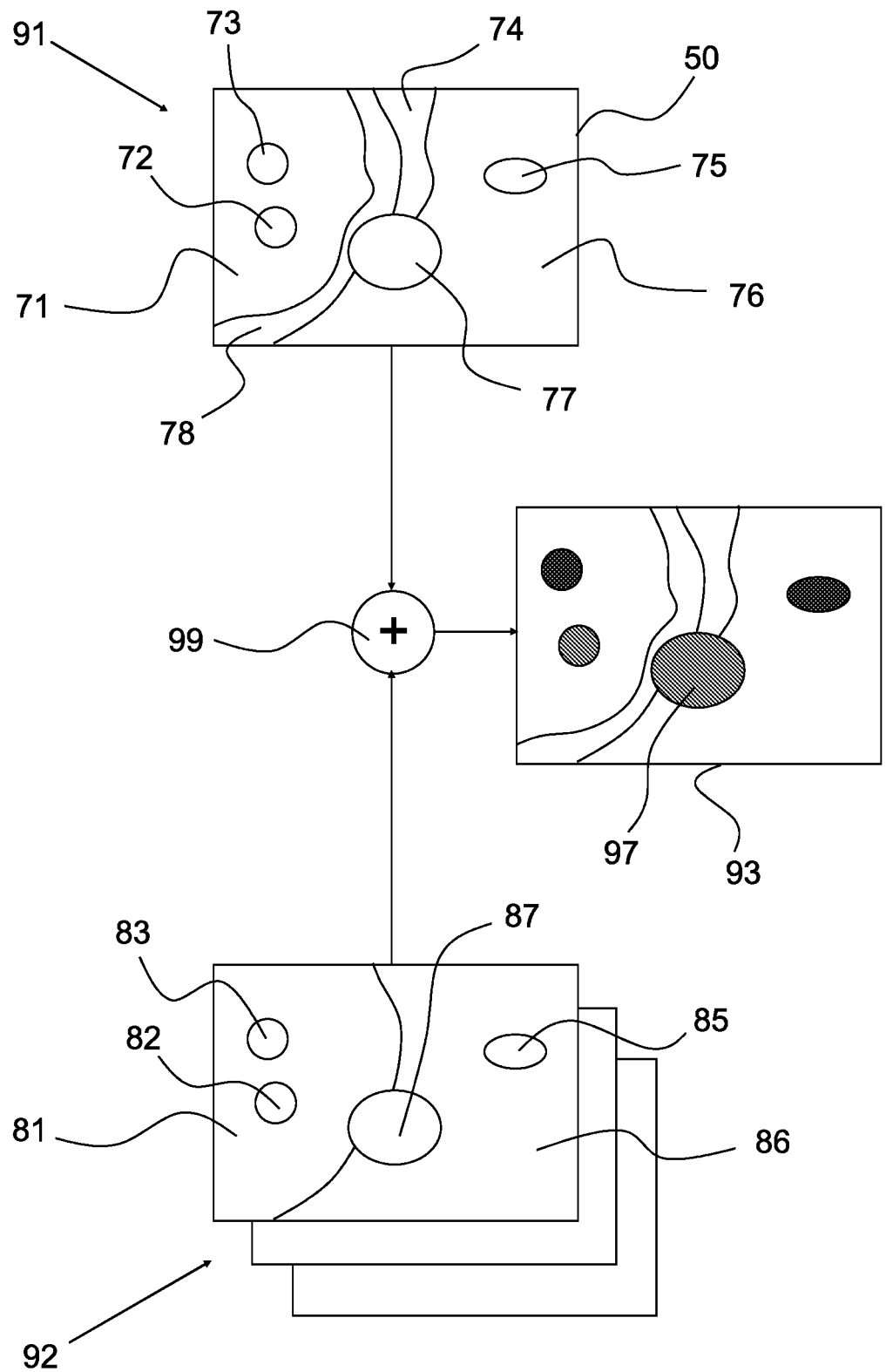
FIG. 6—shows a schematic overview of yet another embodiment of the method according to the disclosure.

In an embodiment, shown in FIG. 6, use is made of a second detector to provide an initial division into regions. Thus, using a second detector, emissions of a second type from the sample 50 in response to said beam scanned over said area of said sample are detected, and the scanned area 50 of the sample is divided into multiple regions 71-78. Then, emissions of the first type (i.e. obtained with the first detector) at different positions along the scan in at least one of said multiple regions 71-78 are combined to produce a combined spectrum 93 of the sample in the region 71-78.

The second detector may be arranged for detecting charged particles, e.g., electrons. Said first detector may be arranged for detecting particles, e.g., photons, such as x-ray photons (by EDS, for example). For example, EM data 91 can be used to make an initial division into regions 71-78, which regions are then at least partly used as boundaries for EDS data 92 to be grouped into a combined spectrum of that region. In particular, EM data 91 is very proficient for providing contour information, which contour information may provide an indication that similar EDS data is to be expected for a particular contour.

FIG. 6 shows that in a first process (top) regions 71-78 are identified using emissions of the second type detected by the second detector. In a second process (bottom) emissions of the first type are detected by the first detector and these are used to define segments 81-87 (comparable as explained with respect to FIGS. 3-5). As more emissions are detected, the segments 81-87 may be redefined, leading to a stacked set 92 of segments. It is possible to use all information of the stacked set 92, or just a single one, for example the latest one. The data 91 obtained in the first process is then combined 99 with the data 92 obtained in the second process, to generate a combined data set 93, for example in the form of a colored image 93. In the combined image, at least one region 77 is identified using the emissions of the second type, and in that region 77 a combined spectrum 97 is provided using emissions of the first type. This way, for example, a single image with increased accuracy may be obtained. As stated before, this single image may contain color information.

It is, in the embodiment of FIG. 6, advantageous in case the first process (top), including the division into regions, is performed before the division of the scanned area into segments. As an example: EM data may be used to define regions based on contours, and EDS data (or comparable data) is used to divide those regions into segments (and sub-segments, if applicable). In general, relatively fast data may be used to make a first division into regions, and relatively slow data is used to divide those regions into segments and sub-segments.

It is conceivable that the area 50 to be scanned is scanned multiple times to obtain the desired data quantity. Scanning multiple times may include scanning only a part of the area 50 of the sample. For example it is conceivable that, based on a first scan (or first set of scans), regions of interest and regions of non-interest are defined, and that only regions of interest are scanned in a second scan (or second set of scans). This increases the efficiency of the method. In particular, the regions of interest may be defined using the data obtained from the emissions of the second type, i.e. the EM data may be used to define regions of interest that are in particular scanned for obtaining EDS data.

The disclosure has been explained above by means of several embodiments.

What is claimed is:

1. A method of examining a sample using a charged particle microscope, comprising:
   detecting, by a first detector, first emissions from the sample in response to a charged particle beam scanned over an area of the sample;
   based on spectral information of the first emissions, dividing at least a part of the area of the sample into multiple segments, wherein each segment of the multiple segments includes different spectral information; and
   combining first emissions at different positions of the scan in at least one of said multiple segments to produce a combined spectrum of the sample in said one of said multiple segments, wherein the combined first emissions include the same spectral information.

2. The method of claim 1, further comprising:
   based on spectral information of the first emissions, dividing at least one of said multiple segments into multiple sub-segments, wherein each sub-segment of the multiple sub-segments includes different spectral information; and combining first emissions at different positions of the scan in at least one of said multiple sub-segments to produce a combined sub-spectrum of the sample in said one of said multiple sub-segments.

3. Method according to claim 2, further comprising forming a colored image of the area of the sample scanned by the charged particle beam based on the segment and sub-segment information.

4. Method according to claim 3, wherein a color space of said colored image comprises hue, value and chroma, and wherein:

first emissions define at least one of hue and chroma of the colored image; and second emissions define value of the colored image.

5. Method according to claim 4, wherein hue defines material properties of the sample, and wherein chroma defines a measure of confidence of said material properties.

6. The method according to claim 1, further comprising:

detecting, by a second detector, second emissions from the sample in response to said charged particle beam scanned over said area of said sample, wherein the second emissions include charged particles of different intensities;

based on the second emissions, dividing the area of the sample into multiple regions, wherein each region of the multiple regions includes different second emissions; and combining second emissions at different positions of the scan in at least one of said multiple regions to produce a combined spectrum of the sample in the region, wherein the combined second emissions include the same charged particle intensity.

7. The method according to claim 6, wherein said step of dividing the scanned area of the sample into multiple regions is performed prior to said step of dividing at least a part of the scanned area of the sample into multiple segments.

8. The method according to claim 6, wherein said step of dividing at least a part of the scanned area of the sample into multiple segments is performed for dividing at least one of the multiple regions.

9. The method according to claim 6, wherein said charged particles are electrons.

10. Method according to claim 6, further comprising:

providing a colored image of said sample based on the different first and second emissions of each segment and region, respectively.

11. The method according to claim 1, wherein said first detector is arranged for detecting particles.

12. The method according to claim 11, wherein the particles are photons.

13. The method according to claim 12, wherein the photons are x-ray photons.

14. Method according to claim 1, further comprising:

additionally scanning at least a part the area of the sample; and detecting, by said first detector, first emissions in response to said additional scanning.

15. A charged particle microscope for examining a sample comprising:

an optics column, including a charged particle source, a final probe forming lens and a scanner, for focusing a beam of charged particles emitted from said charged particle source onto a specimen;

a specimen stage positioned downstream of said final probe forming lens and arranged for holding said specimen;

a first detector for detecting first emissions originating from said specimen in response to the incidence of the beam of charged particles; and a control unit and a processing device connected to said first detector, wherein said charged particle microscope is configured to:

detect, using the first detector, first emissions from the sample in response to the beam of charged particles scanned over an area of the sample;

based on spectral information of first emissions, divide at least a part of the scanned area of the sample into multiple segments; and combine first emissions at different positions of the scan in at least one of said multiple segments to produce a combined spectrum of the sample in said one of said multiple segments.

16. Charged particle microscope according to claim 15, further comprising a second detector for detecting second emissions originating from said specimen in response to the incidence of the beam of charged particles.

17. Charged particle microscope according to claim 16, further comprising an output device for outputting a combination of processed first detector information and of processed second detector information, the output device configured to provide a colored image, wherein a color space of said colored image comprises hue, value and chroma, and wherein:

first emissions define at least one of hue and chroma; and second emissions define value.

18. Charged particle microscope according to claim 16, wherein the charged particle microscope is further configured to generate a single colored image of said sample based on first and second emissions.

19. Charged particle microscope according to claim 18, wherein said colored image is formed based on the segment and sub-segment information.

* * * * *